US011152073B1

(12) United States Patent
Fitzpatrick et al.

(10) Patent No.: US 11,152,073 B1
(45) Date of Patent: Oct. 19, 2021

(54) ITERATIVE READ CALIBRATION ENHANCED ACCORDING TO PATTERNS OF SHIFTS IN READ VOLTAGES

(71) Applicant: Micron Technology, Inc., Boise, ID (US)

(72) Inventors: James Fitzpatrick, Laguna Niguel, CA (US); Sivagnanam Parthasarathy, Carlsbad, CA (US); Patrick Robert Khayat, San Diego, CA (US); AbdelHakim S. Alhussien, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/988,341

(22) Filed: Aug. 7, 2020

(51) Int. Cl.
| G11C 11/34 | (2006.01) |
| G11C 16/26 | (2006.01) |
| G11C 16/10 | (2006.01) |
| G11C 11/56 | (2006.01) |
| G11C 29/50 | (2006.01) |

(52) U.S. Cl.
CPC .......... *G11C 16/26* (2013.01); *G11C 11/5635* (2013.01); *G11C 11/5642* (2013.01); *G11C 16/10* (2013.01); *G11C 29/50004* (2013.01); *G11C 2029/5004* (2013.01)

(58) Field of Classification Search
CPC ......... G11C 16/10; G11C 16/30; G11C 16/12; G11C 16/0483; H01L 27/115
See application file for complete search history.

(56) References Cited

U.S. PATENT DOCUMENTS

| 10,008,276 B2 * | 6/2018 | Huynh | ............... G11C 16/3422 |
| 10,170,195 B1 * | 1/2019 | Ioannou | ................. G11C 29/00 |
| 10,418,097 B2 * | 9/2019 | Avraham | ............ G06F 11/1048 |

\* cited by examiner

Primary Examiner — Son T Dinh
(74) Attorney, Agent, or Firm — Greenberg Traurig

(57) ABSTRACT

A memory sub-system configured to use first values of a plurality of optimized read voltages to perform a first read calibration, which determines second values of the plurality of optimized read voltages. A plurality of shifts, from the first values to the second values respectively, can be computed for the plurality of optimized read voltages respectively. After recognizing a pattern in the plurality of shifts that are computed for the plurality of voltages respectively, the memory sub-system can control and/or initiate a second read calibration based on the recognized pattern in the shifts.

20 Claims, 9 Drawing Sheets

ITERATIVE READ CALIBRATION ENHANCED ACCORDING TO PATTERNS OF SHIFTS IN READ VOLTAGES

FIELD OF THE TECHNOLOGY

At least some embodiments disclosed herein relate to memory systems in general, and more particularly, but not limited to memory systems having self adapting iterative calibrations for reading data from memory cells in an integrated circuit memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
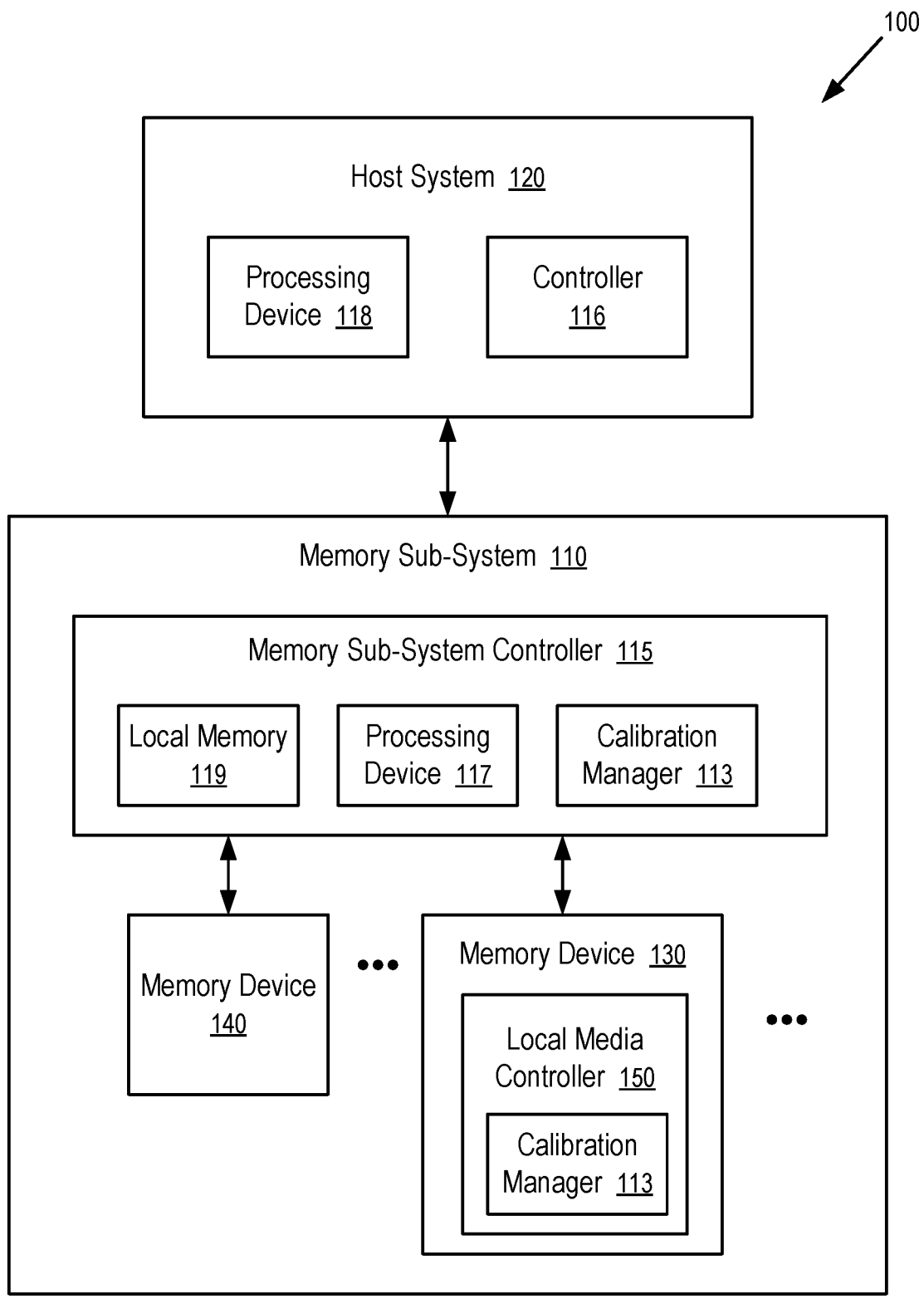
FIG. 1 illustrates an example computing system having a memory sub-system in accordance with some embodiments of the present disclosure.

At least some aspects of the present disclosure are directed to a memory sub-system having a calibration manager configured to identify/recognize a pattern in the shifts of optimized read voltages in a read calibration, and control a further calibration based on the identified pattern. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a threshold voltage. For example, if the memory cell is configured/programmed in a state that allows a substantial current to pass the memory cell at the threshold voltage, the memory cell is storing a bit of one; and otherwise, the memory cell is storing a bit of zero. Further, a memory cell can store multiple bits of data by being configured/programmed differently at multiple threshold voltages. For example, the memory cell can store multiple bits of data by having a combination of states at the multiple threshold voltages; and different combinations of the states of the memory cell at the threshold voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Conventional calibration circuitry has been used to self-calibrate a memory region in applying read level signals to account for shift of threshold voltages of memory cells within the memory region. During the calibration, the calibration circuitry is configured to apply different test signals to the memory region to count the numbers of memory cells that output a specified data state for the test signals. Based on the counts, the calibration circuitry determines a read level offset value as a response to a calibration command.

The test signals can be generated in the vicinity of the expected location of the optimized signal for reading the memory cells. However, when the initial estimation of the expected location of the optimized signal is too far away for the actual location of the optimized signal, the test signals may not be in the vicinity of the location of the optimized signal. Thus, calibration performed based on such test signals, determined based on the expected/estimated location of the optimized signal, may identify the optimized signal with poor precision, or fail to identify the optimized signal.

At least some aspects of the present disclosure address the above and other deficiencies by detecting or recognizing a pattern in the shifts of optimized read voltages determined during an initial iteration of calibration, and controlling or performing a subsequent iteration of calibration based on the detected pattern.

When a memory cell is configured to store more than one bit of information, multiple read voltages are used to read the states of the memory cell under different levels of voltages in determination of the bits of data stored/programmed in the memory cell.

After the memory cell is programmed to be read at the optimized read voltages, some factors can cause the optimized read voltages of the memory cell to shift. For example, the optimized read voltages may shift due to read disturb, quick charge loss (QCL), storage charge loss (SCL), transient voltage threshold (TVT), cross-temperature effect, etc.

Different factors can cause different patterns of shifts in the optimized read voltages of the memory cell. For example, the effect of transient voltage threshold (TVT) can cause systematic upward shifts in the optimized read voltages of the memory cell. In contrast, the effect of charge loss (e.g., QCL or SCL) can cause systematic downward shifts in the optimized read voltages of the memory cell. Read disturb can cause a substantial upward shift in the lowest optimized read voltage but not in other higher optimized read voltages.

The pattern of shifts in the optimized read voltages of the memory cell can be detected/recognized/identified in an initial iteration of calibration and used to infer the dominant factor that causes the shifts detected observed in the calibration of the optimized read voltages in the initial iteration. The detected pattern and/or the inferred dominant factor can be used to guide the calibration operation in the subsequent iteration of calibrating the optimized read voltages.

When the optimized read voltages have consistent, systematic up shifts toward higher voltages (e.g., caused by TVT effects), coarse calibration of higher optimized read voltages can be performed progressively based on the results of fine calibration of lower optimized read voltages.

For example, a fine calibration of a lower optimized read voltage can be performed by measuring signal and noise characteristics of the memory cells in a test voltage range near an initial estimate of the optimized read voltage. Based on the signal and noise characteristics measured in the test voltage range, a calibrated estimate of the optimized read voltage can be calculated and used to determine the shift from the initial estimate to the calibrated estimate. When the shifts in optimized read voltages of the memory cells are systematic and upward, the initial estimate of a higher optimized read voltage can be coarsely calibrated to a value based on the shift from the initial estimate of the lower optimized read voltage to the calibrated estimate of the lower optimized read voltage. Thus, the coarsely calibrated estimate can be used to select the test voltage range for the fine calibration of the upper optimized read voltage. The coarse calibration can improve the chance that the test voltage range captures the upper optimized read voltage and/or is substantially centered around the upper optimized read voltage.

When applied correctly, a coarse calibration can improve the starting point of a fine calibration where signal and noise characteristics of a group of memory cells are measured to compute a calibrated value of the optimized read voltage. However, when applied incorrectly, a coarse calibration can generate worse results in the fine calibration than without the coarse calibration.

When a NAND memory block has recently been erased or has not been read for a period of time, the memory cells settle to a stable state. Subsequently, when a read voltage is applied to the memory block (e.g., during a calibration operation or a read operation), the memory cells enter a transient state. When the memory block is initially in the stable state and then calibrated, the shifts in the optimized read voltages can be dominated by the TVT effect, resulting from the memory cells entering the transient state from the stable state. Since the TVT effect can reduce or diminish during and/or after subsequent read operations (e.g., for fine calibrations), the shifts in the optimized read voltages that are dominated by the TVT effect are not used in a subsequent read/calibration; and the memory device can perform another iteration of fine calibration (e.g., using the initial estimates obtained before the initial calibration), which mitigates the TVT effect through a subsequent calibration.

In some instances, the shifts in optimized read voltages measured during the transition from the stable state of a memory to the transient state of the memory cell are caused primarily by the effect of transient voltage threshold (TVT). Such a situation can be recognized based on the detection of systematic upward shifts in the optimized read voltages calibrated during an initial read calibration operation. Since the TVT effect is expected to reduce or disappear in a subsequent calibration operation, the detection/recognition of the pattern of shifts resulting primarily from TVT effect can be used by the memory device to initiate/control the subsequent read calibration operation. To discount the TVT effect, the results of the initial calibration operation can be discarded and not used as a starting point of the subsequent calibration.

In some instances, the shifts in optimized read voltages measured during the initial calibration are caused primarily by charge loss (e.g., QCL or SCL). Such a situation can be recognized based on the detection of systematic downward shifts in the optimized read voltages calibrated during the initial read calibration operation. Since the effect of charge loss is persistent, the recognition of the shift pattern associated with charge loss can be used to control a subsequent calibration. The results of the initial calibration operation can be used as a starting point of the subsequent calibration.

In some instances, the shifts in optimized read voltages measured during the initial calibration are caused primarily by read disturb, which can cause a pattern of shifts in optimized read voltages of the memory cells where the directions of shifting of the optimized read voltages are not the same and the lowest optimized read voltage shifts upward. In response to such a pattern of shifts typically associated with read disturb, the memory device can invoke a procedure to handle read disturb.

When the directions of shifting of the optimized read voltages are not the same and the lowest optimized read voltage shifts downward, the memory cells can be flagged to have read noise where some adjacent optimized read voltages move apart to have wider voltage gaps and other adjacent optimized read voltages move toward each other to have narrower voltage gaps. In such a situation, the reliability window between a pair of adjacent optimized read voltages increases at the expense of neighboring pairs of adjacent optimized read voltages. The memory device can examine whether any of the optimized read voltages has been calibrated into a wrong region globally where calibration according to signal and noise characteristics measured in a test voltage range configured according to the current estimate of the optimized read voltage actually drives the calibration away from the optimized read voltage. For example, the memory device can generate a profile of the widths of (e.g., voltage gaps between) adjacent optimized read voltages as a side product of a read calibration operation. The detection of a pattern of widening in some of the widths but narrowing in other widths can be used to flag read noise. When read noise has cause an optimized read voltage to be calibrated into a wrong region globally, the result of the prior calibration can be ignored/discard. Since read noise can resolve from read to read, read/calibration can be repeated for improved results.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130,140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 150) for media management within the same memory device package. An example of a managed memory device is a managed NAND (MNAND) device.

The controller 115 and/or a memory device 130 can include a calibration manager 113 configured to determine/recognize a pattern in the shifts of optimized read voltages of a group of memory cells and use the pattern to control the further calibration of the optimized read voltages of the group of memory cells. In some embodiments, the controller 115 in the memory sub-system 110 includes at least a portion of the calibration manager 113. In other embodiments, or in combination, the controller 116 and/or the processing device 118 in the host system 120 includes at least a portion of the calibration manager 113. For example, the controller 115, the controller 116, and/or the processing device 118 can include logic circuitry implementing the calibration manager 113. For example, the controller 115, or the processing device 118 (processor) of the host system 120, can be configured to execute instructions stored in memory for performing the operations of the calibration manager 113 described herein. In some embodiments, the calibration manager 113 is implemented in an integrated circuit chip disposed in the memory sub-system 110. In other embodiments, the calibration manager 113 can be part of firmware of the memory sub-system 110, an operating system of the host system 120, a device driver, or an application, or any combination therein.

For example, during or after the calibration of a plurality of optimized read voltages of a group of memory cells, the calibration manager 113 can determine whether the optimized read voltages have all shifted upward, or all shifted downward, or shifted upward only in the lowest optimized read voltage but not in other higher optimized read voltages, etc.

When a pattern of systematic upward shifts is detected in the optimized read voltages of the group of memory cells, the calibration manager 113 can recognize the shifts as a result of TVT effect. To mitigate the TVT effect, the calibration manager 113 can discard the result of the current calibration and perform another calibration that has reduced or diminished TVT effect.

When a pattern of systematic downward shifts is detected in the optimized read voltages of the group of memory cells, the calibration manager 113 can recognize the shifts as a result of charge loss (e.g., SCL or QCL). Since the effect of charge loss is persistent, the calibration manager 113 can use the optimized read voltages of the group of memory cells determined in the current calibration as the starting point for the next calibration. For example, the optimized read voltages determined in the current calibration as the initial estimates of the corresponding optimized read voltages in the next calibration.

When a pattern of shifts is detected where the lowest optimized read voltage shifts upward but the remaining optimized read voltages do not shift upward, the calibration manager 113 can recognize the pattern of shifts as a result of read disturb and apply a procedure to handle read disturb.

When a pattern of shifts is detected where the lowest optimized read voltage does not shift upward and some gaps between adjacent optimized read voltages are narrowing and other gaps widening, the calibration manager 113 can recognize the pattern of shifts as a result of read noise. In response, the calibration 113 may determine whether any of the optimized read voltages have been calibrated to a wrong region globally and/or repeat a calibration operation.

Figure 2:
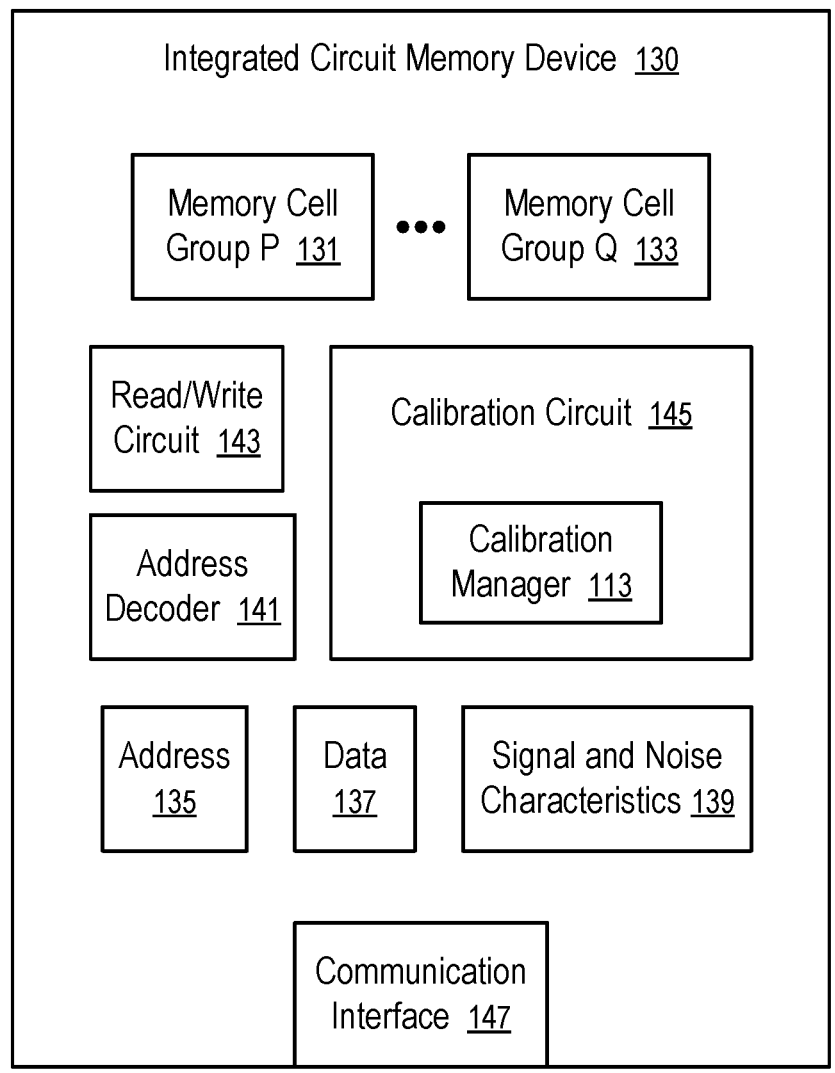
FIG. 2 illustrates an integrated circuit memory device having a calibration circuit configured to measure signal and noise characteristics according to one embodiment.

FIG. 2 illustrates an integrated circuit memory device 130 having a calibration circuit 145 configured to measure signal and noise characteristics according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, ..., 133 of memory cells that can be formed in one or more integrated circuit dies. A typical memory cell in a group 131, ..., 133 can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive an address 135 from the controller 115 of a memory sub-system 110 and to provide the data retrieved from the memory address 135. An address decoder 141 of the integrated circuit memory device 130 converts the address 135 into control signals to select the memory cells in the integrated circuit memory device 130; and a read/write circuit 143 of the integrated circuit memory device 130 performs operations to determine data stored in the addressed memory cells or to program the memory cells to have states corresponding to storing the data.

The integrated circuit memory device 130 has a calibration circuit 145 configured to determine measurements of signal and noise characteristics 139 of memory cells in a group (e.g., 131, ..., or 133) and provide the signal and noise characteristics 139 to the controller 115 of a memory sub-system 110 via the communication interface 147.

In at least some embodiments, the calibration circuit 145 also provides, to the controller 115 via the communication interface 147, the signal and noise characteristics 139 measured to determine the read level offset value. In some embodiments, the read level offset value can be used to understand, quantify, or estimate the signal and noise characteristics 139. In other embodiments, the statistics of memory cells in a group or region that has a particular state at one or more test voltages can be provided as the signal and noise characteristics 139.

For example, the calibration circuit 145 can measure the signal and noise characteristics 139 by reading different responses from the memory cells in a group (e.g., 131, ..., 133) by varying operating parameters used to read the memory cells, such as the voltage(s) applied during an operation to read data from memory cells.

For example, the calibration circuit 145 can measure the signal and noise characteristics 139 on the fly when executing a command to read the data from the address 135. Since the signal and noise characteristics 139 are measured as part of the operation to read the data from the address 135, the signal and noise characteristics 139 can be used in the calibration manager 113 with reduced or no penalty on the latency in the execution of the command to read the data from the address 135.

The calibration manager 113 of the memory sub-system 110 is configured to use the signal and noise characteristics 139, measured during calibration of one or more lower optimized read voltages of a group of memory cells (e.g., 131 or 133), to identify an estimated location of a higher optimized read voltage and thus improve the calibration operation performed for the higher optimized read voltage.

For example, the calibration manager 113 can use a predictive model, trained via machine learning or established via an empirical formula, to predict the location of the higher optimized read voltage. The predication can be based on an initial estimation of the location of the higher optimized read voltage, the initial estimation(s) of the location of the one or more lower optimized read voltages, and the calibrated locations of the one or more lower optimized read voltages, where the calibrated locations of the one or more lower optimized read voltages are determined from the signal and noise characteristics 139 measured during the calibration of the one or more lower optimized read voltages. The prediction can be used in the calibration of the higher optimized read voltage, during which further signal and noise characteristics 139 can be measured in the vicinity of the predicted location to identify a calibrated location of the higher optimized read voltage. The result of the calibration of the higher optimized read voltage can be further used in the calibration of even further higher optimized read voltage iteratively.

Figure 3:
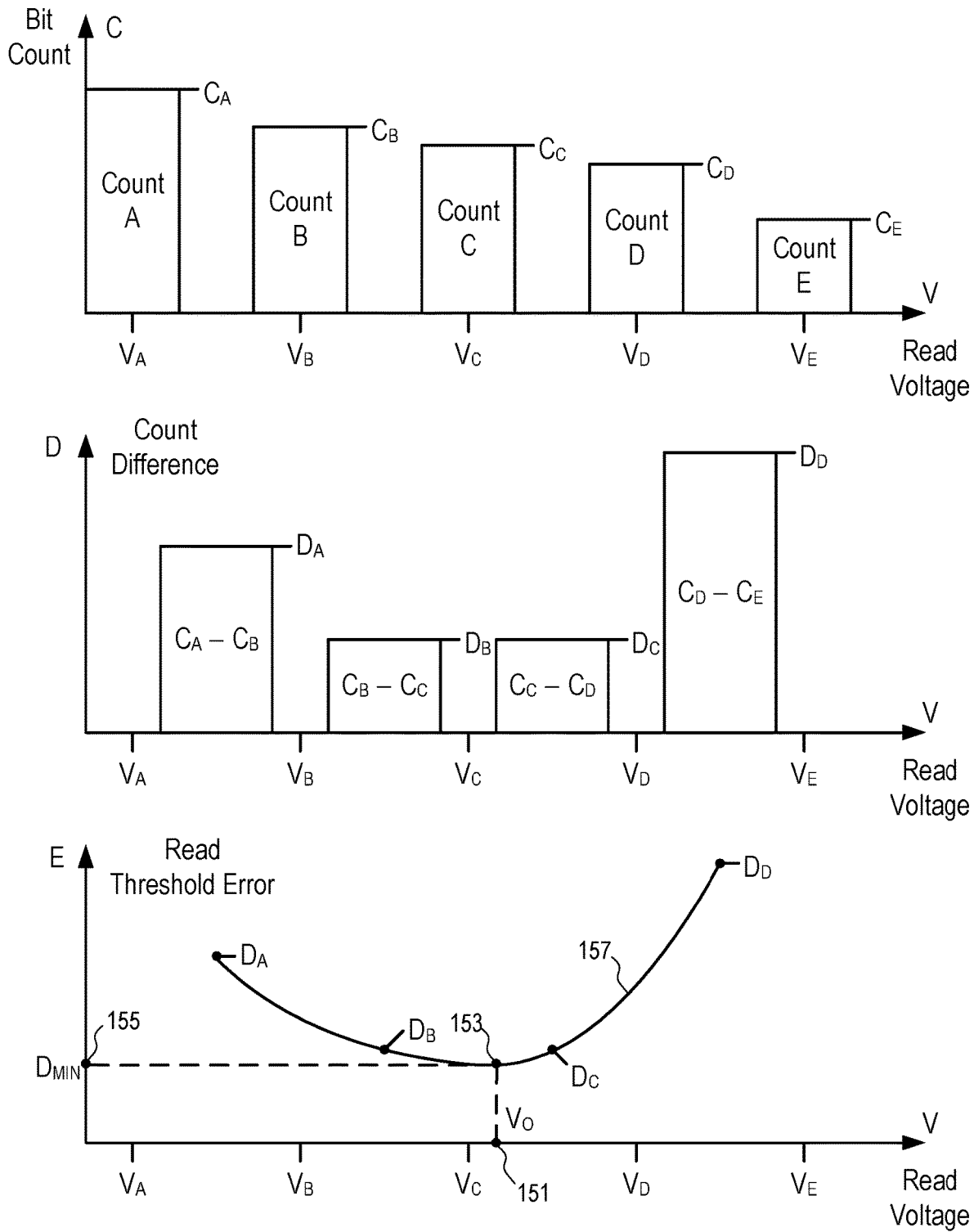
FIG. 3 shows an example of measuring signal and noise characteristics to improve memory operations according to one embodiment.

FIG. 3 shows an example of measuring signal and noise characteristics 139 to improve memory operations according to one embodiment.

In FIG. 3, the calibration circuit 145 applies different read voltages $V_A$, $V_B$, $V_C$, $V_D$, and $V_E$ to read the states of memory cells in a group (e.g., 131, ..., or 133). In general, more or less read voltages can be used to generate the signal and noise characteristics 139.

As a result of the different voltages applied during the read operation, a same memory cell in the group (e.g., 131, ..., or 133) may show different states. Thus, the counts $C_A$, $C_B$, $C_C$, $C_D$, and $C_E$ of memory cells having a predetermined state at different read voltages $V_A$, $V_B$, $V_C$, $V_D$, and $V_E$ can be different in general. The predetermined state can be a state of having substantial current passing through the memory cells, or a state of having no substantial current passing through the memory cells. The counts $C_A$, $C_B$, $C_C$, $C_D$, and $C_E$ can be referred to as bit counts.

The calibration circuit 145 can measure the bit counts by applying the read voltages $V_A$, $V_B$, $V_C$, $V_D$, and $V_E$ one at a time on the group (e.g., 131, ..., or 133) of memory cells.

Alternatively, the group (e.g., 131, ..., or 133) of memory cells can be configured as multiple subgroups; and the calibration circuit 145 can measure the bit counts of the subgroups in parallel by applying the read voltages $V_A$, $V_B$, $V_C$, $V_D$, and $V_E$. The bit counts of the subgroups are considered as representative of the bit counts in the entire group (e.g., 131, ..., or 133). Thus, the time duration of obtaining the counts $C_A$, $C_B$, $C_C$, $C_D$, and $C_E$ can be reduced.

In some embodiments, the bit counts $C_A$, $C_B$, $C_C$, $C_D$, and $C_E$ are measured during the execution of a command to read the data from the address 135 that is mapped to one or more memory cells in the group (e.g., 131, . . . , or 133). Thus, the controller 115 does not need to send a separate command to request for the signal and noise characteristics 139 that is based on the bit counts $C_A$, $C_B$, $C_C$, $C_D$, and $C_E$.

The differences between the bit counts of the adjacent voltages are indicative of the errors in reading the states of the memory cells in the group (e.g., 133, . . . , or 133).

For example, the count difference $D_A$ is calculated from $C_A$-$C_B$, which is an indication of read threshold error introduced by changing the read voltage from $V_A$ to $V_B$.

Similarly, $D_B$=$C_B$-$C_C$; $D_C$=$C_C$-$C_D$; and $D_D$=$C_D$-$C_E$.

The curve 157, obtained based on the count differences $D_A$, $D_B$, $D_C$, and $D_D$, represents the prediction of read threshold error E as a function of the read voltage. From the curve 157 (and/or the count differences), the optimized read voltage $V_O$ can be calculated as the point 153 that provides the lowest read threshold error $D_{MIN}$ on the curve 157.

In one embodiment, the calibration circuit 145 computes the optimized read voltage $V_O$ and causes the read/write circuit 143 to read the data from the address 135 using the optimized read voltage $V_O$.

Alternatively, the calibration circuit 145 can provide, via the communication interface 147 to the controller 115 of the memory sub-system 110, the count differences $D_A$, $D_B$, $D_C$, and $D_D$ and/or the optimized read voltage $V_O$ calculated by the calibration circuit 145.

FIG. 3 illustrates an example of generating a set of statistical data (e.g., bit counts and/or count differences) for reading at an optimized read voltage $V_O$. In general, a group of memory cells can be configured to store more than one bit in a memory cell; and multiple read voltages are used to read the data stored in the memory cells. A set of statistical data can be similarly measured for each of the read voltages to identify the corresponding optimize read voltage, where the test voltages in each set of statistical data are configured in the vicinity of the expected location of the corresponding optimized read voltage. Thus, the signal and noise characteristics 139 measured for a memory cell group (e.g., 131 or 133) can include multiple sets of statistical data measured for the multiple threshold voltages respectively.

For example, the controller 115 can instruct the memory device 130 to perform a read operation by providing an address 135 and at least one read control parameter. For example, the read control parameter can be a read voltage that is suggested, estimated, or predicted by the controller 115.

The memory device 130 can perform the read operation by determining the states of memory cells at the address 135 at a read voltage and provide the data according to the determined states.

During the read operation, the calibration circuit 145 of the memory device 130 generates the signal and noise characteristics 139. The data and the signal and noise characteristics 139 are provided from the memory device 130 to the controller 115 as a response. Alternatively, the processing of the signal and noise characteristics 139 can be performed at least in part using logic circuitry configured in the memory device 130. For example, the processing of the signal and noise characteristics 139 can be implemented partially or entirely using the processing logic configured in the memory device 130. For example, the processing logic can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

The signal and noise characteristics 139 can be determined based at least in part on the read control parameter. For example, when the read control parameter is a suggested read voltage for reading the memory cells at the address 135, the calibration circuit 145 can compute the read voltages $V_A$, $V_B$, $V_C$, $V_D$, and $V_E$ that are in the vicinity of the suggested read voltage.

The signal and noise characteristics 139 can include the bit counts $C_A$, $C_B$, $C_C$, $C_D$, and $C_E$. Alternatively, or in combination, the signal and noise characteristics 139 can include the count differences $D_A$, $D_B$, $D_C$, and $D_D$.

Optionally, the calibration circuit 145 uses one method to compute an optimized read voltage $V_O$ from the count differences $D_A$, $D_B$, $D_C$, and $D_D$; and the controller 115 uses another different method to compute the optimized read voltage $V_O$ from the signal and noise characteristics 139 and optionally other data that is not available to the calibration circuit 145.

When the calibration circuit 145 can compute the optimized read voltage $V_O$ from the count differences $D_A$, $D_B$, $D_C$, and $D_D$ generated during the read operation, the signal and noise characteristics can optionally include the optimized read voltage $V_O$. Further, the memory device 130 can use the optimized read voltage $V_O$ in determining the hard bit data in the data from the memory cells at the address 135. The soft bit data in the data can be obtained by reading the memory cells with read voltages that are a predetermined offset away from the optimized read voltage $V_O$. Alternatively, the memory device 130 uses the controller-specified read voltage provided in the read control parameter in reading the data.

The controller 115 can be configured with more processing power than the calibration circuit 145 of the integrated circuit memory device 130. Further, the controller 115 can have other signal and noise characteristics applicable to the memory cells in the group (e.g., 133, . . . , or 133). Thus, in general, the controller 115 can compute a more accurate estimation of the optimized read voltage $V_O$ (e.g., for a subsequent read operation, or for a retry of the read operation).

In general, it is not necessary for the calibration circuit 145 to provide the signal and noise characteristics 139 in the form of a distribution of bit counts over a set of read voltages, or in the form of a distribution of count differences over a set of read voltages. For example, the calibration circuit 145 can provide the optimized read voltage $V_O$ calculated by the calibration circuit 145, as signal and noise characteristics 139.

The calibration circuit 145 can be configured to generate the signal and noise characteristics 139 (e.g., the bit counts, or bit count differences) as a byproduct of a read operation. The generation of the signal and noise characteristics 139 can be implemented in the integrated circuit memory device 130 with little or no impact on the latency of the read operation in comparison with a typical read without the generation of the signal and noise characteristics 139. Thus, the calibration circuit 145 can determine signal and noise characteristics 139 efficiently as a byproduct of performing a read operation according to a command from the controller 115 of the memory sub-system 110.

In general, the calculation of the optimized read voltage $V_O$ can be performed within the memory device 130, or by a controller 115 of the memory sub-system 111 that receives the signal and noise characteristics 139 as part of enriched status response from the memory device 130.

A memory cell programmed to store multiple bits of data is to be read using multiple read voltages to determine the states of the memory cells at the read voltages and thus the multiple bits stored in the memory cell. The optimized read voltages for reading the multiple states can shift due to data retention effects, such as Quick Charge Loss (QCL), Storage Charge Loss (SCL), etc., and/or other effects. Over a period of time, the optimized read voltages can shift in a same direction (e.g., toward lower voltages, or toward higher voltages). In general, different optimized read voltages can shift by different amounts, where the higher ones in the optimized read voltages may shift more than the lower ones in the optimized read voltages.

A predictive model can be used to predict the shift of a higher optimized read voltage based on the shift(s) of one or more lower optimized read voltages. Thus, once the lower optimized read voltages are determined through calibration, the shift of an optimized read voltage higher than the lower optimized read voltages can be predicted/estimated to correct the initial estimation of the expected location of the higher optimized read voltage. Using the corrected estimation, the calibration for the higher optimized read voltage can be performed to identify an optimized read voltage with improved precision and/or to avoid a failure in calibration.

For example, the calibration manager 113 can receive signal and noise characteristics measured for one or more lower optimized read voltages of the memory cells in the memory device 130 and process the signal and noise characteristics to predict an improved estimation of the location of an optimized read voltage of the memory cells, which is higher than the one or more lower optimized read voltages. For example, the amount of adjustment from initial estimated read voltage to a lower optimized read voltage can be used as an indicator of where to adjust the initial estimate for the calibration of the next read voltage.

For example, a controller 115 of the memory sub-system 110 can initially identify the expected/estimated/predicted locations of the multiple optimized read voltages for reading the states of each memory cell in a group for executing a read command. In response to the read command, the calibration manager 113 causes the memory device 130 to calibrate the lowest one of the multiple optimized read voltages first, using the expected/estimated/predicted location of the lowest optimized read voltage initially identified by the controller 115. The calibration results in the identification of an optimized location of the lowest optimized read voltage, which can have an offset or shift from the expected/estimated/predicted location of the lowest optimized read voltage. The offset or shift of the lowest optimized read voltage can be used to predict/estimate the offset or shift of the second lowest optimized read voltage, and thus improve or correct the expected/estimated/predicted location of the second lowest optimized read voltage. The improved or corrected location for the estimation of the second lowest optimized read voltage can be used in its calibration, which results in the identification of an optimized location of the second lowest optimized read voltage. Subsequently, a further higher optimized read voltage of the memory cells can be calibrated using an improved or corrected location determined from its initial estimated identified by the controller 115 and one or more offsets/shifts of one or more optimized read voltages as calibrated from their initial estimations. Thus, the higher optimized read voltages of a memory cell can be iteratively and adaptively calibrated based on the results of the lower optimized read voltages of the memory cell.

FIGS. 4-7 illustrate self adapting iterative read calibration during the execution of a read command according to one embodiment. For example, the self adapting iterative read calibration can be controlled by a calibration manager 113, which can be implemented in the controller 115 of the memory sub-system 110 of FIG. 1, and/or in an integrated circuit memory device 130 of FIG. 2, using the signal and noise characteristics 139 measured according to FIG. 3.

Figure 4:
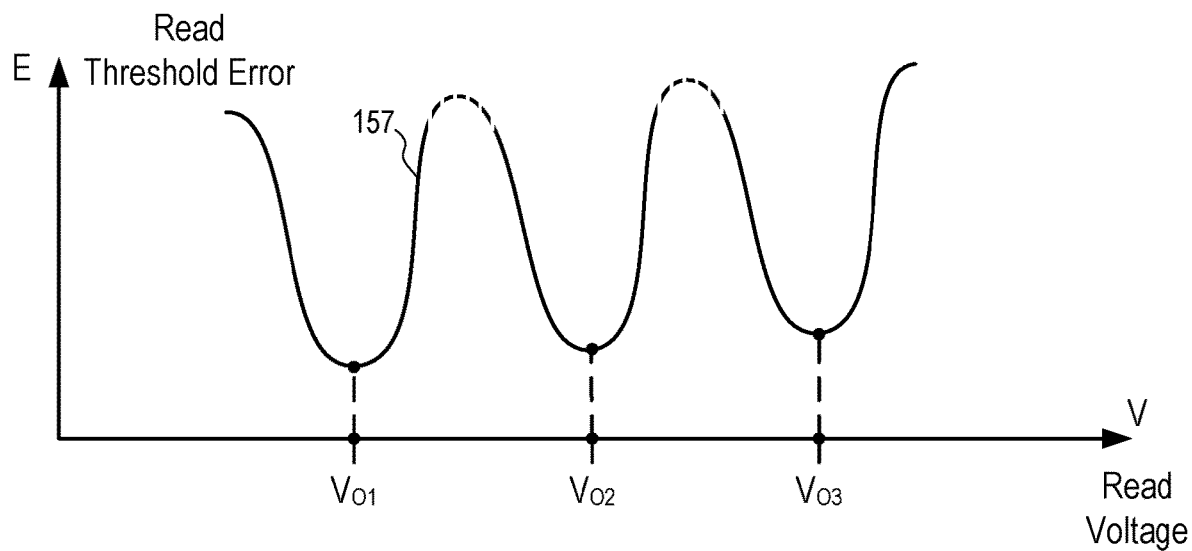
FIGS. 4-7 illustrate self adapting iterative read calibration during the execution of a read command according to one embodiment.

FIG. 4 illustrates a read threshold error distribution 157 for reading a group of memory cells (e.g., 131 or 133) at various read voltages. The optimized read voltages $V_{O1}$, $V_{O2}$, and $V_{O3}$ have locations corresponding to local minimum points of the read threshold error distribution 157. When the group of memory cells (e.g., 131 or 133) is read at the optimized read voltages $V_{O1}$, $V_{O2}$, and $V_{O3}$ respectively, the errors in the states determined from the read operations are minimized.

FIG. 4 illustrates an example with multiple optimized read voltages $V_{O1}$, $V_{O2}$, and $V_{O3}$ for reading a group of memory cells (e.g., 131 or 133). In general, a group of memory cells (e.g., 131 or 133) can be programmed to be read via more or less optimized read voltages as illustrated in FIG. 4.

The read threshold error distribution 157 can be measured using the technique illustrated in FIG. 3 (e.g., by determining bit count differences of neighboring read voltages).

When the group of memory cells (e.g., 131 or 133) is initially programmed, or recently calibrated, the locations of the optimized read voltages $V_{O1}$, $V_{O2}$, and $V_{O3}$ are known. However, after a period of time, the locations of the optimized read voltages $V_{O1}$, $V_{O2}$, and $V_{O3}$ can shift, e.g., due to Quick Charge Loss (QCL), Storage Charge Loss (SCL), etc.

Figure 5:
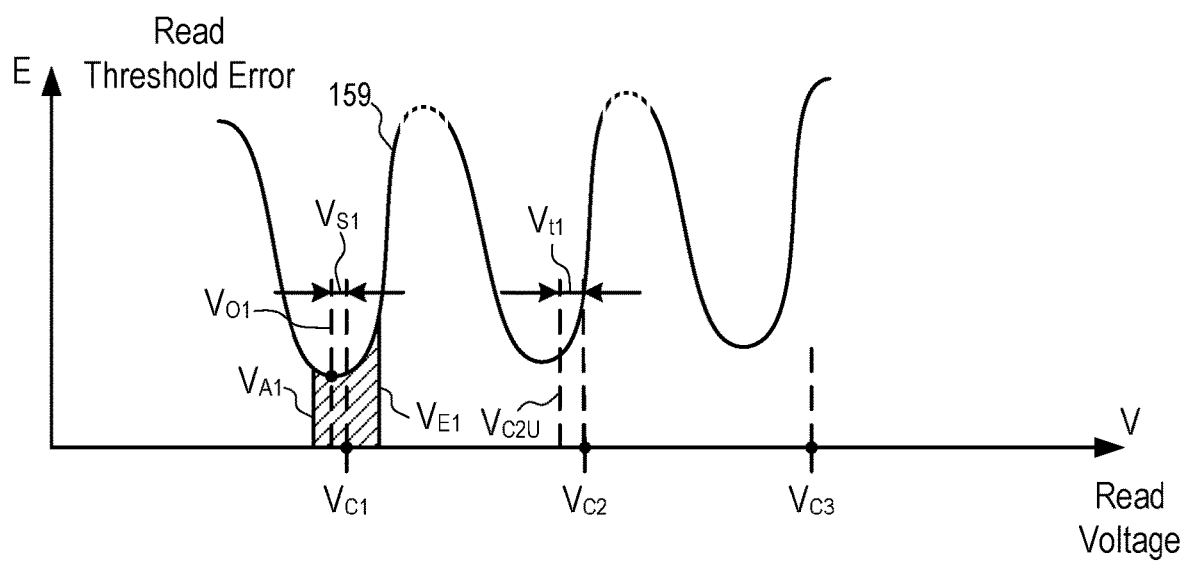
Figure 6:
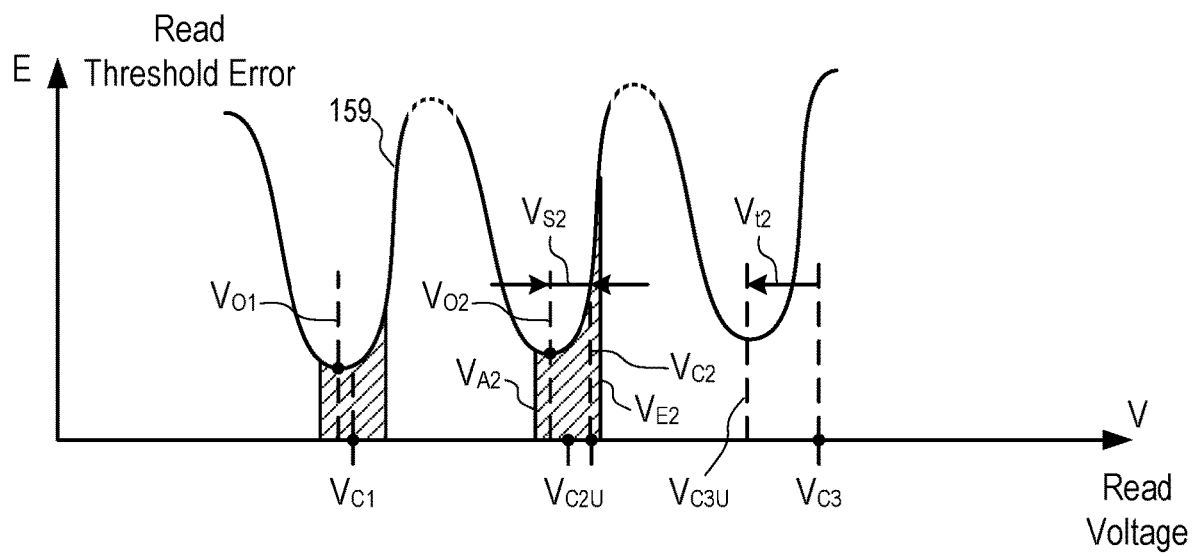
Figure 7:
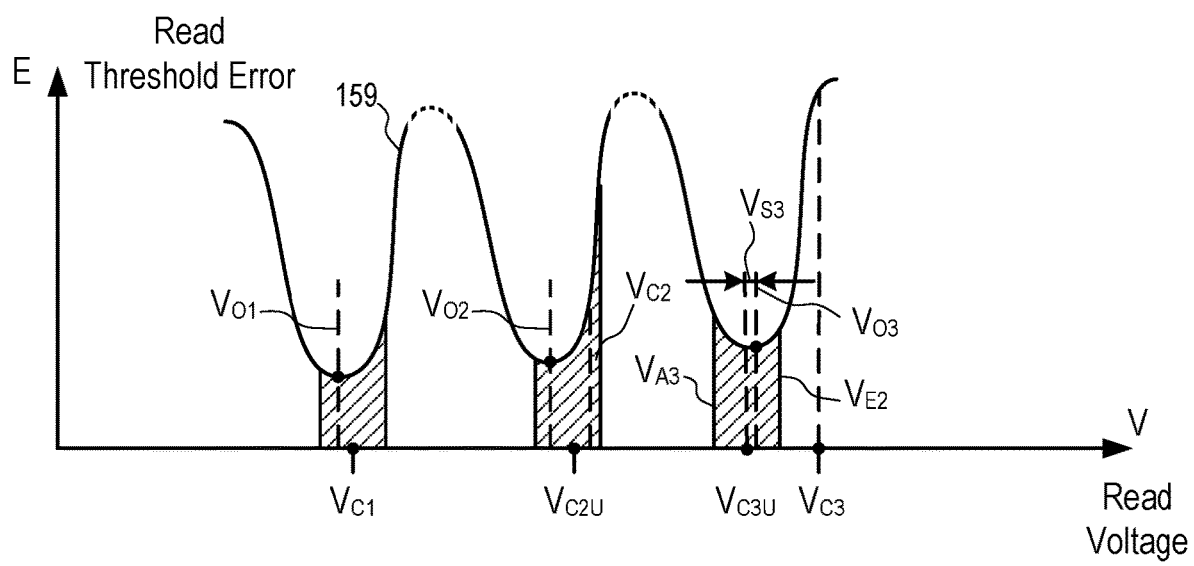

FIGS. 5-7 illustrate a read threshold error distribution 159 where the locations of the optimized read voltages have shifted on the axis of read voltage. For example, the locations of the optimized read voltages $V_{O1}$, $V_{O2}$, and $V_{O3}$ can shift downward such that the new location has a voltage smaller than the corresponding prior location. In other examples, the locations of the optimized read voltages $V_{O1}$, $V_{O2}$, and $V_{O3}$ can shift upward such that the new location has a voltage larger than the corresponding prior location.

The calibration technique of FIG. 3 determines the location of an optimized read voltage (e.g., $V_O$) on the axis of the read voltage by sampling a portion of the read threshold error distribution 157 in the vicinity of an estimated location (e.g., $V_C$) and determine the location of the local minimum point of the sampled read threshold error distribution 157.

To determine locations of the optimized read voltages that have shifted, the previously known locations of the optimized read voltages $V_{O1}$, $V_{O2}$, and $V_{O3}$ can be used as estimated locations (e.g., $V_C$) for the application of the calibration technique of FIG. 3.

FIGS. 5-7 illustrate the estimated locations $V_{C1}$, $V_{C2}$, and $V_{C3}$ of the optimized read voltages $V_{O1}$, $V_{O2}$, and $V_{O3}$ relative to the new read threshold error distribution 159. In some instances, the controller 115 can compute the estimated locations $V_{C1}$, $V_{C2}$, and $V_{C3}$, based on a formula and/or a predictive model, using parameters available to the controller 115.

FIG. 5 illustrates the application of the technique of FIG. 3 to determine the location of the lowest optimized read voltage $V_{O1}$. Test voltages in the range of $V_{A1}$ to $V_{E1}$ are configured in the vicinity of the estimated location $V_{C1}$. The test voltages $V_{A1}$ to $V_{E1}$ can be applied to read the group of memory cells (e.g., 131 or 133) to determine bit counts at the test voltages, and the count differences that are indicative of the magnitude of read threshold errors. The optimized read voltage Vol can be determined at the local minimum point of the portion of the read threshold error distribution 159 sampled via the measured bit differences; and the offset or shift $V_{S1}$ from the estimated location $V_{C1}$ to the calibrated location Vol can be used to determine the estimated shift $V_{t1}$ from the estimated location $V_{C2}$ for the next, higher optimized read voltage $V_{O2}$.

For example, the estimated shift $V_{t1}$ can be determined as the same as the measured shift $V_{S1}$ in the lower optimized read voltage Vol from its initial estimation $V_{C1}$. An alternative empirical formula or predictive model can be used to calculate the estimated shift $V_{t1}$ of the higher optimized read voltage $V_{O2}$ from at least the measured shift $V_{S1}$ of the lower optimized read voltage $V_{O2}$.

The estimated shift $V_{t1}$ determines the improved estimation $V_{C2U}$ of the location of the optimized read voltage $V_{O2}$.

FIG. 6 illustrates the application of the technique of FIG. 3 to determine the location of the optimized read voltage $V_{O2}$. After adjusting the estimation from $V_{C2}$ to $V_{C2U}$, test voltages in the range of $V_{A2}$ to $V_{E2}$ are configured in the vicinity of the improved estimation $V_{C2U}$ (instead of relative to $V_{C2}$). As a result of the improved estimation $V_{C2U}$, the test voltage range from $V_{A2}$ to $V_{E2}$ is better positioned to capture the optimized read voltage $V_{O2}$. The test voltages $V_{A2}$ to $V_{E2}$ can be applied to read the group of memory cells (e.g., 131 or 133) to determine bit counts at the test voltages, and the count differences that are indicative of the magnitude of read threshold errors. The optimized read voltage Vol can be determined at the local minimum point of the portion of the read threshold error distribution 159 sampled via the measuring of the bit differences; and the offset or shift $V_{S2}$ from the initial estimated location $V_{C2}$ to the calibrated location Vol can be used in determining the estimated shift $V_{t2}$ from the estimated location $V_{C3}$ for the next, higher optimized read voltage $V_{O3}$.

For example, the estimated shift $V_{t2}$ can be determined as the same as the measured shift $V_{S2}$ in the lower optimized read voltage Vol from its initial estimation $V_{C2}$. Alternatively, the estimated shift $V_{t2}$ can be determined as a function of both the measured shift $V_{S2}$ in the lower optimized read voltage Vol from its initial estimation $V_{C2}$ and the measured shift $V_{S1}$ in the further lower optimized read voltage Vol from its initial estimation $V_{C1}$. An alternative empirical formula or predictive model can be used to calculate the estimated shift $V_{t2}$ of the higher optimized read voltage $V_{O3}$ from at least the measured shift(s) (e.g., $V_{S2}$ and/or $V_{S1}$) of one or more lower optimized read voltages (e.g., $V_{O2}$ and/or $V_{S1}$).

The estimated shift $V_{t2}$ provides the improved estimation $V_{C3U}$ of the location of the optimized read voltage $V_{O2}$.

FIG. 7 illustrates the application of the technique of FIG. 3 to determine the location of the optimized read voltage $V_{O3}$. Test voltages in the range of $V_{A3}$ to $V_{E3}$ are configured in the vicinity of the improved estimation $V_{C3U}$. The test voltages $V_{A3}$ to $V_{E3}$ can be applied to read the group of memory cells (e.g., 131 or 133) to determine bit counts at the test voltages, and the count differences that are indicative of the magnitude of read threshold errors. The optimized read voltage $V_{O3}$ can be determined at the local minimum point of the portion of the read threshold error distribution 159 sampled via the bit differences.

As illustrated in FIGS. 6 and 7, the improved estimates $V_{C2U}$ and $V_{C3U}$, calculated adaptively and iteratively, allow the calibrations of higher optimized read voltages $V_{O1}$ and $V_{O3}$ to be performed in improved test voltage ranges that are close to the optimized read voltages $V_{O1}$ and $V_{O3}$. If the test voltages were to be constructed using the initial estimations $V_{C2}$ and $V_{C3}$, the test ranges might not capture the optimized read voltages $V_{O1}$ and $V_{O3}$; and calibrations might fail to identify the optimized read voltages $V_{O1}$ and $V_{O3}$, or fail to identify the optimized read voltages $V_{O1}$ and $V_{O3}$ with sufficient accuracy.

FIGS. 5 to 7 illustrate an example of calibration starting from the lowest read optimized voltage to the highest optimized read voltage, in which the calibration results of lower read voltages are used to improve the calibration of higher read voltages. In general, calibrations of read voltages can be performed in alternative orders. For example, calibration can start from a higher read voltage, or from the highest read optimized voltage to the lowest optimized read voltage, where the calibration results of higher read voltages can be used to improve the calibration of lower read voltages.

In general, the calibration manager 113 can be implemented in the memory device 130 and/or in the controller 115 of the memory sub-system 110. For example, a calibration manager 113 can be implemented in the memory device 130 and configured to iteratively determine the improved estimations (e.g., $V_{C2U}$ and $V_{C3U}$) of the higher read voltages (e.g., $V_{O2}$ and $V_{O3}$) using the results of the calibrations of the lower read voltages (e.g., $V_{O1}$ and $V_{O2}$). The calibration manager 113 implemented in the memory device 130 can calibrate the multiple read voltages (e.g., $V_{O1}$, $V_{O2}$, $V_{O3}$) in an atomic operation without communicating with the controller during the atomic operation.

Alternatively, a calibration manager 113 can be implemented in the controller 150. After the memory device 130 reports the calibration result of lower read voltages (e.g., Vol and $V_{O2}$) to the controller 150, the calibration manager 113 calculates the improved estimations (e.g., $V_{C2U}$ and $V_{C3U}$) and communicates the improved estimations (e.g., $V_{C2U}$ and $V_{C3U}$) to cause the memory device 130 to calibrate the higher read voltages (e.g., $V_{O2}$ and $V_{O3}$) using the improved estimations (e.g., $V_{C2U}$ and $V_{C3U}$).

The calibration manager 113 implemented in the controller 115 can use not only the signal and noise characteristics 139 received from the memory device 130 for the data but also other information that may not be available in the memory device 130, such as charge loss, read disturb, cross-temperature effect, program/erase, data retention, etc. The calibration manager 113 implemented in the controller 115 and the calibration manager 113 implemented in the memory device 130 can have different complexity, and/or different levels of accuracy in their predictions. The calibration manager 113 implemented in the controller 115 and the calibration manager 113 implemented in the memory device 130 can communicate with each other to collaboratively control the calibration operations performed by the calibration circuit 145. For example, the controller 115 can issue a command to the memory device 130 indicating a lot of charge loss, read disturb, cross-temperature effect, etc. in memory cells involved in a read operation thus allowing the calibration manager 113 implemented in the memory device 130 to adapt initial estimates of read voltages based on the knowledge of the states of the memory cells.

The processing logic of the calibration manager 113 can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

Figure 8:
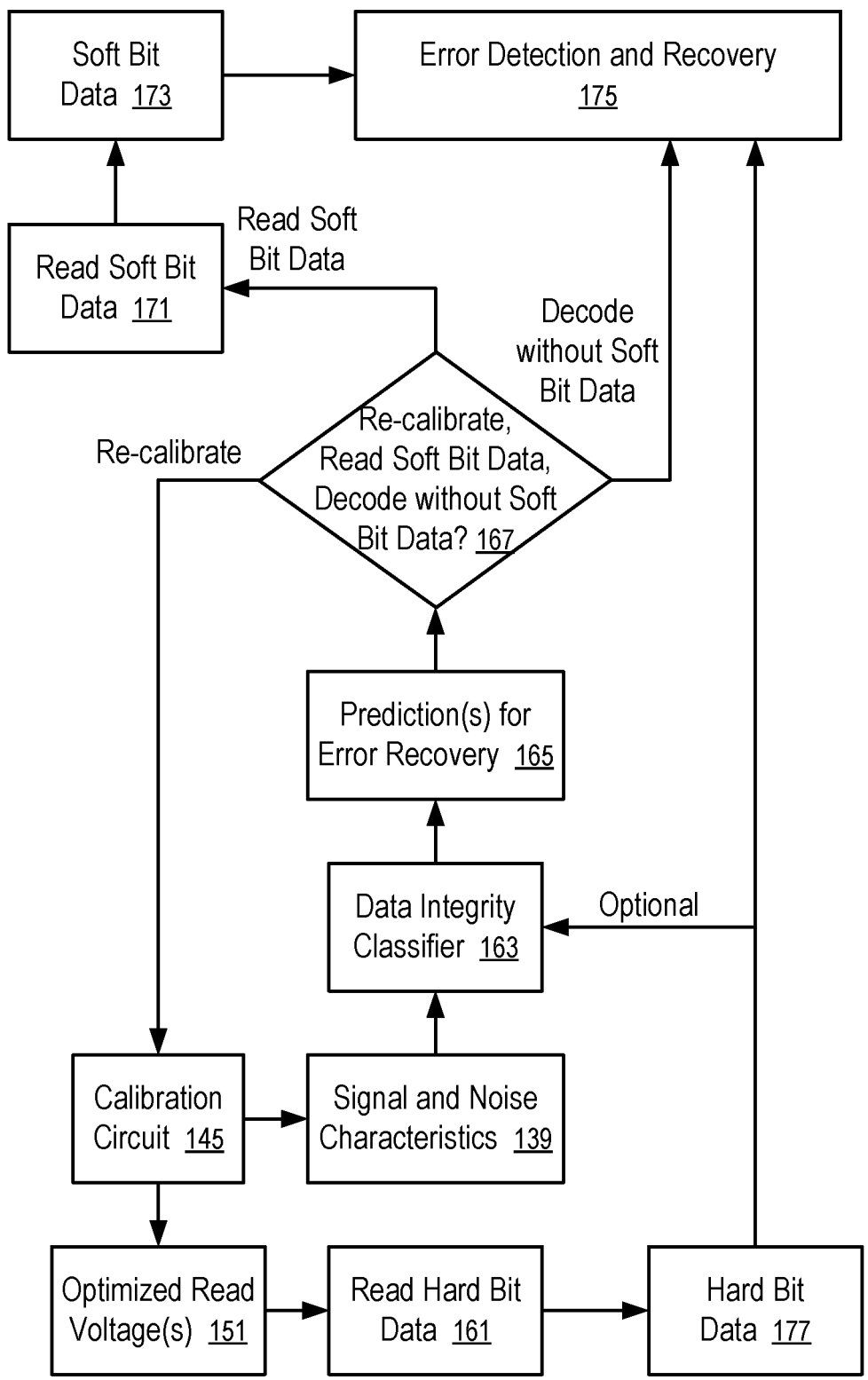
FIG. 8 illustrates adaptive and/or iterative operations to retrieve data from memory cells during the execution of a read command according to one embodiment.

FIG. 8 illustrates adaptive and/or iterative operations to retrieve data from memory cells during the execution of a read command according to one embodiment. For example, the adaptive and/or iterative operations of a calibration manager 113 according to FIG. 8 can be implemented in the controller 115 of the memory sub-system 110 of FIG. 1, and/or in an integrated circuit memory device 130 of FIG. 2, using the signal and noise characteristics 139 measured according to FIG. 3.

The sub-operations of FIG. 8 are performed in response to a read command. To execute the read command, the calibration circuit 145 of the memory device 130 measures the signal and noise characteristics 139 using voltages in the vicinity of the suspected location(s) of optimized read voltage(s). For example, the signal and noise characteristics 139 can include bit counts and/or bit differences at read voltages near expected value of the optimize read voltage illustrated in FIG. 3.

The calibration circuit 145 can determine an optimized read voltage(s) 151 from the measured signal and noise characteristics 139 (e.g., in a way as illustrated in FIG. 3). The read/write circuit 143 of the memory device 130 can use the optimized read voltage(s) to read 161 the hard bit data 177. For example, the read/write circuit 143 applies the optimized read voltage(s) the memory cells at the address identified by the read command, and determine the states of the memory cells and thus the corresponding hard bit data 177.

In general, the data retrieved from the memory cells using the optimized read voltages 151 includes at least the hard bit data 177 and can have errors. The data can optionally further include soft bit data 173 read 171 at a predetermined offset(s) from the optimized read voltage(s) 151.

A data integrity classifier 163 determines a prediction(s) 165 for the results of error recovery for the data retrieved from the memory cells according to the optimized read voltages 151.

For example, the data retrieved from the memory cells of the memory device is in an encoded format that allows error detection and recovery 175 (e.g., using techniques such as Error Correction Code (ECC), Low-Density Parity-Check (LDPC) code). The signal and noise characteristics 139 can be provided as input to the data integrity classifier 163 to evaluate the likelihood of the data having too many errors for success decoding the data by some or all the processing paths/modules/options in error detection and recovery 175.

For example, the memory sub-system 110 can include a low power ECC, a full power ECC, an LDPC decoder that does not use soft bit data, and/or an LDPC decoder that uses both hard bit data and soft bit data in decoding. In general, available paths/modules/options for decoding the data in a memory sub-system 110 are not limited to such the examples; different processing paths/modules/options can be implemented; and the different processing paths/modules/options have different power consumption levels, different capabilities in recovering error-free original/non-encoded data from the retrieve raw data, and/or different processing latency.

The data integrity classifier 163 can be trained (e.g., through machine learning) to predict the likelihood of data integrity failure of the data based on the associated signal and noise characteristics 139.

For example, the likelihood of data integrity failure of the data can be in the form of an estimated bit error rate in the data.

For example, the likelihood of data integrity failure of the data can be in the form of a prediction of whether the data can be successfully decoded (e.g., via ECC or LDPC) by any of the processing paths/modules/options for error detection and recovery 175 and if so, which of the processing paths/modules/options is or are predicted to be able to successfully decode the data having the associated signal and noise characteristics 139.

For example, some of the processing paths/modules/options are implemented in the memory device 130; and some of the processing paths/modules/options are implemented in the controller 115.

Based on the predicted likelihood of data integrity failure of the data, the calibration manager 113 can select one of the processing paths/modules/options with reduced power consumption, reduced processing latency, and/or a high probability of success in decoding.

In some embodiments, the data integrity classifier 163 is trained to directly provide a prediction of an optimized processing path/module (e.g., 171, 173, 175, or 177) to process the encoded data retrieved from the memory cells of the memory device 130.

In some embodiments, the data integrity classifier 163 is trained to provide a prediction of a prioritized list of processing paths/modules/options (e.g., 171, 173, 175, and/or 177) that can successfully decode the encoded data. Further, the data integrity classifier 163 can further provide an indication of the confidence levels of the selected listed processing paths/modules/options (e.g., 171, 173, 175, and/or 177) in successfully decoding the data.

Optionally, the data integrity classifier 163 can also be trained to evaluate the confidence levels of the prediction(s) 165; and the confidence levels can be used in the selection of an option from the available paths/modules/options in error detection and recovery 175.

Based on the prediction(s) 165, the calibration manager 113 determines 167 whether to re-calibrate the read thresholds, or to read 171 soft bit data 173, or to decode hard bit data 177 without soft bit data 173. When the calibration manager 113 determines 167 that the data retrieved or retrievable according to the optimized read voltage 151 is going to fail in all decoders in error recovery 175 implemented in the memory sub-system 110, the calibration manager 113 instructs the calibration circuit 145 to perform a further calibration (e.g., based on a modified identification of a neighborhood to search for the optimized voltage(s) 151). The iterative calibrations can be performed up to a predetermined threshold of iterations, or until at least one decoder in the memory sub-system 110 is predicted to be able to decode the data retrieved/retrievable based on the calibrated/optimized read voltages. In general, such data for the decoders implemented in the can include hard bit data 177 read using the optimized read voltages, and optionally soft bit data 173 read using read voltages at a predetermined offset(s) away from the optimized read voltages.

After the predetermined threshold of iterations, if the predictions 165 indicate that the data retrieved or retrievable from the memory cells will fail to decode, the memory device 130 can report a failure for the read command.

Optionally, the calibration manager 113 executes the read 161 of the hard bit data 177 only after the predictions 165 indicate that the data can decode using at least one decoder implemented in the memory sub-system 110.

When the predictions 165 indicate that data can decode using at least one decoder implemented in the memory sub-system 110, the calibration manager 113 further determines whether soft bit data 173 is needed for a selected processing paths/modules/options of error detection and recovery 175; and if so, the calibration manager 113 executes the read 171 of the soft bit data 173 by reading the memory cells using read voltages that are at the predetermined offset(s) away from the optimized read voltage(s) 151.

In general, the calibration manager 113 can be implemented in the memory device 130 and/or in the controller 115 of the memory sub-system 110. For example, one calibration manager 113 can be implemented in the memory device 130 and customized for scheduling sub-operations in the memory device 130 during the execution of a read command; and another calibration manager 113 can be implemented in the controller 115 and customized for scheduling sub-operations for the execution of the read command through communications between the memory device 130 and the controller 115. The calibration manager 113 implemented in the memory device 130 can schedule sub-operations for the read command without communicating with the controller 115. Optionally, no read manager is implemented in the controller 115.

The calibration manager 113 implemented in the controller 115 can use not only the signal and noise characteristics 139 received from the memory device 130 for the data but also other information that may not be available in the memory device 130, such as charge loss, read disturb, cross-temperature effect, program/erase, data retention, etc. The calibration manager 113 implemented in the controller 115 and the calibration manager 113 implemented in the memory device 130 can have different complexity, and/or different levels of accuracy in their predictions. The calibration manager 113 implemented in the controller 115 and the calibration manager 113 implemented in the memory device 130 can communicate with each other to collaboratively schedule sub-operations for the execution of the read command.

Optionally, the memory device 130 provides its prediction 165 to the controller 115; and the controller 115 uses the prediction 165 generated by the memory device 130 and/or other information to select a path/module/option for decoding the data. Alternatively, the controller 115 can be independent from the memory device 130 in selecting a path/module/option for decoding the data.

Some of the paths/modules/options of the error detection and recovery 175 can be implemented in the memory device 130. When a path/module/option implemented in the memory device 130 is selected/scheduled for the execution of the read command, the execution of the path/module/option can be scheduled as part of the atomic operation of executing the read command in the memory device 130.

The processing logic of at least a portion of the error detection and recovery 175 and the calibration manager 113 can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

A calibration manager 113 can include a data integrity classifier 163. When the data integrity classifier 163 is implemented in the memory device 130, the output of the data integrity classifier 163 can be used in controlling the retrieval of the data (e.g., the hard bit data 177 and/or the soft bit data 173).

For example, when the output of the data integrity classifier 163 indicates that the encoded data is likely to be decoded using a decoder (e.g., 177) that uses soft bit data, the calibration manager 113 of the memory device 130 can automatically further read 171 the soft bit data 173 in addition to reading 161 the hard bit data 177. However, if the data integrity classifier indicates that the hard bit data 177 can be decoded using a decoder (e.g., 175) that does not require soft bit data 173 as input, the calibration manager 113 of the memory device 130 can skip the sub-operations to read 171 soft bit data 173 and/or the operations to transmit the soft bit data to the controller 115.

For example, when the output of the data integrity classifier 163 indicates that none of the available paths/modules/options in the memory sub-system 111 is likely to be successful in decoding the data (e.g., including the hard bit data 177 and the soft bit data 173), the calibration manager 113 of the memory device 130 can automatically schedule a sub-option of read-retry to search for an improved read voltage(s) as part of the atomic operation of executing the read command in the memory device 130. Further, the calibration manager 113 of the memory device 130 can optionally skip reading 161 the hard bit data 177 when the output of the data integrity classifier 163 indicates that none of the available paths/modules/options in the error detection and recovery 175 is likely to be successful in decoding the data.

Figure 9:
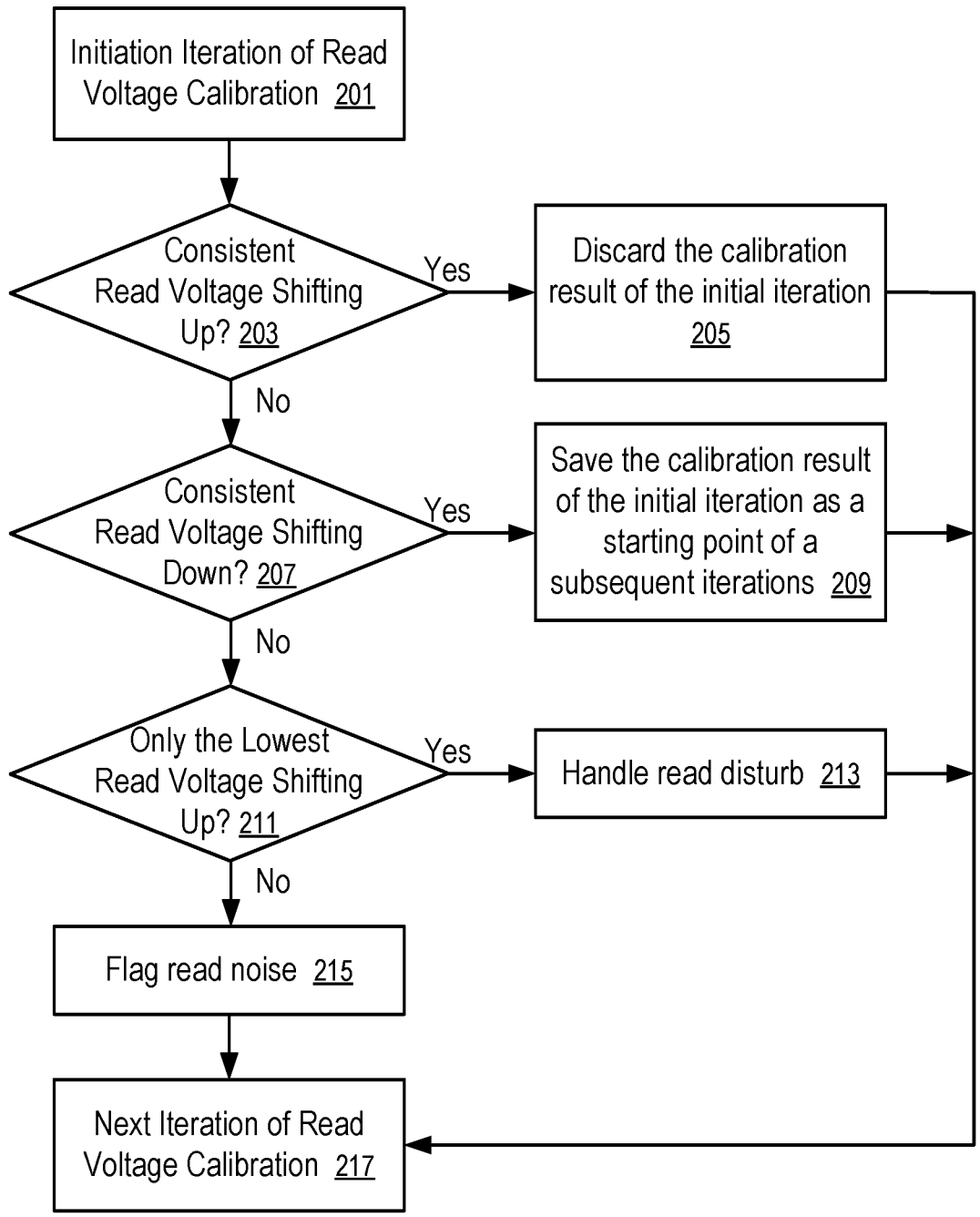
FIG. 9 illustrates a technique to use the pattern in the shifts of optimized read voltages to control a subsequent calibration according to one embodiment.

FIG. 9 illustrates a technique to use the pattern in the shifts of optimized read voltages to control a subsequent calibration according to one embodiment.

In FIG. 9, an initial iteration 201 of read voltage calibration is performed for a group of memory cells (e.g., 131 or 133).

For example, the calibration can be performed by the calibration circuit 145 measuring the signal and noise characteristics 139 and the data integrity classifier 163 generating prediction(s) 165 as in FIG. 8. For example, the calibration can be performed using a technique of self adapting iterative read calibration illustrated in FIGS. 4-7.

During, or after the initial iteration 201 of read voltage calibration, the calibration manager 113 can detect or recognize the pattern of shifts in the optimize read voltages of the group of memory cells (e.g., 131 or 133).

When the calibration manager 113 detects or recognizes the pattern where optimized read voltages of the group of memory cells (e.g., 131 or 133) consistently shift upward 203, the calibration manage 113 can discard 205 the calibration result of the initial iteration for the mitigation of TVT effect.

Otherwise 203, the calibration manager 113 may detect or recognize the pattern where optimized read voltages of the group of memory cells (e.g., 131 or 133) consistently shift downward 207. In response to such a pattern, the calibration manager 113 can save 209 the calibration results of the initial iteration as the starting point of a subsequent iteration/calibration.

Otherwise 207, the calibration manager 113 may detect or recognize the pattern where only the lowest read voltage shifts up 211. In response to such a pattern, the calibration manager 113 can perform operations to handle 213 read disturb.

Otherwise 211, the calibration manager 113 may detect or recognize the pattern where the lowest read voltage does not shift up and some gaps between optimized read voltage increase and other gaps decrease. In response to such a pattern, the calibration manager 113 can flag 215 read noise in the calibration results, which may cause an optimized read voltage to be calibrated/estimated to be in a wrong region globally. When the calibrated/estimated value of the optimized read voltage is in a wrong region global, minimizing the count difference locally according to the test voltage range configured around the estimate can result in an estimate that moves further away from the optimized read voltage and/or moves toward an adjacent optimized read voltage.

Thus, the detected/recognized pattern in the shifts of optimized read voltages calculated in an initial iteration 201 of read voltage calibration can be used to set up, adjust, or control the initial conditions for the next iteration 217. For example, the initial conditions for the next iteration 217 can include what initial estimates of the optimized read voltages are to be used in the next iteration 217.

Figure 10:
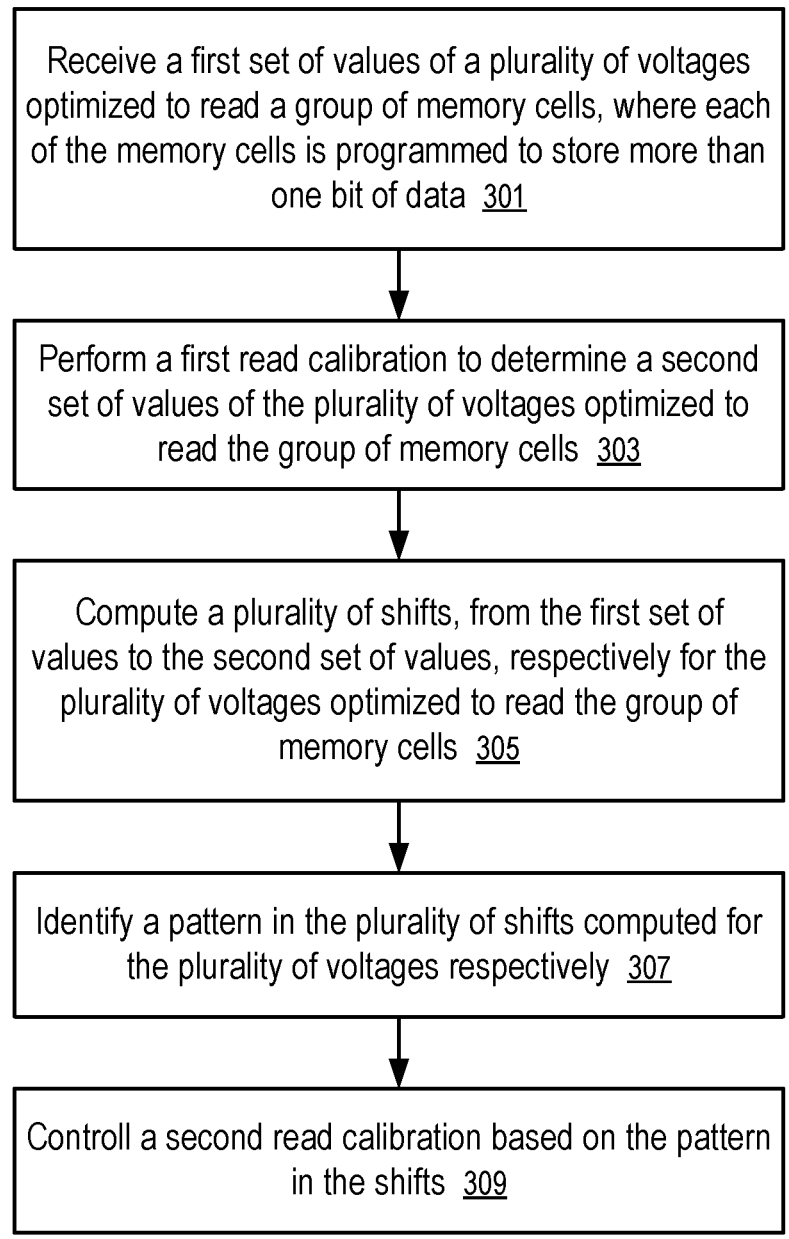
FIG. 10 shows a method of read calibration according to one embodiment.

FIG. 10 shows a method of read calibration according to one embodiment. The method of FIG. 10 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 10 is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 10 can be implemented in a computing system of FIG. 1 with a memory device of FIG. 2 and signal noise characteristics illustrated in FIG. 3, in a way as illustrated in FIGS. 4-7 using the techniques of FIGS. 8 and/or 9.

At block 301, a calibration manager 113 receives a first set of values (e.g., $V_{C1}$, $V_{C2}$, $V_{C3}$) of a plurality of voltages optimized to read a group of memory cells (e.g., 131 or 133), where each of the memory cells is programmed to store more than one bit of data. For example, the first set of values (e.g., $V_{C1}$, $V_{C2}$, $V_{C3}$) can be the last known set of optimized read voltages of the group of memory cells (e.g., 131 or 133); and the optimized read voltages may shift due to factors such as transient voltage threshold, charge loss, read disturb, read noise, etc.

At block 303, the calibration manager 113 performs a first read calibration (e.g., 201) to determine a second set of values (e.g., $V_{O1}$, $V_{O2}$, $V_{O3}$) of the plurality of voltages optimized to read the group of memory cells (e.g., 201).

For example, as illustrated in FIG. 3, to determine a calibrated value of the optimized read voltage $V_O$ based on an initial estimate $V_C$, the memory device 130 can ramp up the read voltage applied on the group of memory cells to $V_C$ to count the number of memory cells that output one (or zero) as the bit count $C_C$ at $V_C$. Then, the memory device 130 can boost modulate read voltages of four sub-groups in the group to $V_A$, $V_B$, $V_C$ and $V_E$ respectively in parallel to count the number of memory cells that output one (or zero) at $V_A$, $V_B$, $V_D$ and $V_E$ respective. The counts of the sub-groups can be scaled according to the population ratio(s) between sub-groups and the entire group to determine the bit counts $C_A$, $C_B$, $C_D$ and $C_E$ respectively.

Alternatively, the memory device 130 can read the group of memory cells at $V_A$ to $V_E$ sequentially to determine the bit counts $C_A$ to $C_E$.

The bit counts can be used to compute the count differences $D_A$, $D_B$, $D_C$, and $D_D$. The calibrated value of the optimized read voltage $V_O$ can be computed from locating the voltage $V_O$ that reaches the $D_{MIN}$ in the count distribution over the test voltage range $V_A$ to $V_E$.

When a memory cell is programmed to store multiple bits, multiple read voltages are used to read the states of the memory cells at different voltages to decode the bits stored in the memory cell. The read voltages optimized to read the memory cells at different levels can be each calibrated in as illustrated in FIG. 3. Further, the calibration results of the lower optimized read voltages can be used to perform coarse calibration to determine the higher optimized read voltages, in a way illustrated in FIGS. 4 to 7. For example, the second set of values of the plurality of voltages can be $V_{O1}$, $V_{O2}$, $V_{O3}$ illustrated in FIG. 7, having shifted from their initial estimates $V_{C1}$, $V_{C2}$, $V_{C3}$ respectively.

At block 305, the calibration manager 113 computes a plurality of shifts (e.g., $V_{S1}=V_{C1}-V_{O1}$, $V_{S2}+V_{t1}=V_{C2}-V_{O2}$, $V_{S3}+V_{t2}=V_{C3}-V_{O3}$), from the first set of values (e.g., $V_{C1}$, $V_{C2}$, $V_{C3}$) to the second set of values (e.g., $V_{O1}$, $V_{O2}$, $V_{O3}$), respectively for the plurality of voltages optimized to read the group of memory cells (e.g., 131 or 133).

As illustrated in FIGS. 4-7, the higher read voltages (e.g., $V_{O2}$, $V_{O3}$) can be calibrated coarsely using the shifts (e.g., $V_{t1}$, $V_{t2}$) predicted based on the shifts in the lower read voltages (e.g., $V_{O1}$, $V_{O2}$). Fine calibration can be performed by measuring count distributions over test voltage ranges that are centered at coarse calibration results (e.g., $V_{C2U}$, $V_{C3U}$).

At block 307, the calibration manager 113 identifies a pattern in the plurality of shifts (e.g., $V_{S1}=V_{C1}-V_{O1}$, $V_{S2}+V_{t1}=V_{C2}-V_{O2}$, $V_{S3}+V_{t2}=V_{C3}-V_{O3}$) computed for the plurality of optimized read voltages respectively.

For example, the pattern can be identified via checking whether the shifts (e.g., $V_{S1}=V_{C1}-V_{O1}$, $V_{S2}+V_{t1}=V_{C2}-V_{O2}$, $V_{S3}+V_{t2}=V_{C3}-V_{O3}$) are consistently upward, consistently downward, or only upward in the lowest read voltage, or downward in the lowest read voltage, as illustrated in FIG. 9.

The pattern can be identified for association with transient voltage threshold, charge loss, read disturb, or read noise.

When the shifts (e.g., $V_{S1}=V_{C1}-V_{O1}$, $V_{S2}+V_{t1}=V_{C2}-V_{O2}$, $V_{S3}+V_{t2}=V_{C3}-V_{O3}$) are consistently downward where the second set of values (e.g., $V_{O1}$, $V_{O2}$, $V_{O3}$) are consistently smaller than the first set of values (e.g., $V_{C1}$, $V_{C2}$, $V_{C3}$) respectively (e.g., as illustrated in FIG. 7), the pattern of the shifts can be determined to be associated with charge loss.

In contrast, when the shifts are consistently upward where the second set of values are consistently larger than the first set of values respectively, the pattern of the shifts can be determined to be associated with transient voltage threshold.

In other instances, when the shifts do not have the pattern of consistently shifting in a same direction, the direction of shifting in the lowest read voltage (e.g., from $V_{C1}$ to $V_{O1}$) is checked. If the direction (e.g., from $V_{C1}$ to $V_{O1}$) is upward, the pattern is associated with read disturb; and if the direction (e.g., from $V_{C1}$ to $V_{O1}$) is downward, the pattern is associated with read noise.

At block 309, the calibration manager 113 controls a second read calibration (e.g., 217) based on the pattern in the shifts.

For example, in response to a determination that the pattern is associated with transient voltage threshold, the second read calibration is performed without using the second set of values (e.g., $V_{O1}$, $V_{O2}$, $V_{O3}$). The memory device 130 can automatically initiate the second calibration to mitigate the effect of transient voltage threshold. The results of the first calibration (e.g., $V_{O1}$, $V_{O2}$, $V_{O3}$) can be discarded. In the second calibration, the first set of values (e.g., $V_{C1}$, $V_{C2}$, $V_{C3}$), instead of the second set of values (e.g., $V_{O1}$, $V_{O2}$, $V_{O3}$), are used as initial estimates of the plurality of voltages optimized to read the group of memory cells.

For example, in response to a determination that the pattern is associated with charge loss, the second values obtained from the first calibration (e.g., $V_{O1}$, $V_{O2}$, $V_{O3}$) can be saved to overwrite the first values (e.g., $V_{C1}$, $V_{C2}$, $V_{C3}$) so that the second read calibration is performed using the second set of values (e.g., $V_{O1}$, $V_{O2}$, $V_{O3}$), instead of the first set of values (e.g., $V_{C1}$, $V_{C2}$, $V_{C3}$), as initial estimates of the plurality of voltages optimized to read the group of memory cells during the second read calibration.

For example, in response to a determination that the pattern is associated with read disturb, the memory device 130 can optionally perform an operation to address the effect of read disturb.

For example, in response to a determination that the pattern is associated with read noise, the memory device 130 can perform an operation to mitigate the effect of read noise. For example, the memory device 130 can initiate the second calibration using the first set of values (e.g., $V_{C1}$, $V_{C2}$, $V_{C3}$) as the initial estimates of the optimized read voltages. For example, the memory device 130 can determine whether any of the second set of values (e.g., $V_{O1}$, $V_{O2}$, $V_{O3}$) has been calibrated into a wrong region and/or identify an improved initial estimate of the optimized read voltage that has been calibrated into the wrong region.

A non-transitory computer storage medium can be used to store instructions of the firmware of a memory sub-system (e.g., 110). When the instructions are executed by the controller 115 and/or the processing device 117, the instructions cause the controller 115 and/or the processing device 117 to perform the methods discussed above.

Figure 11:
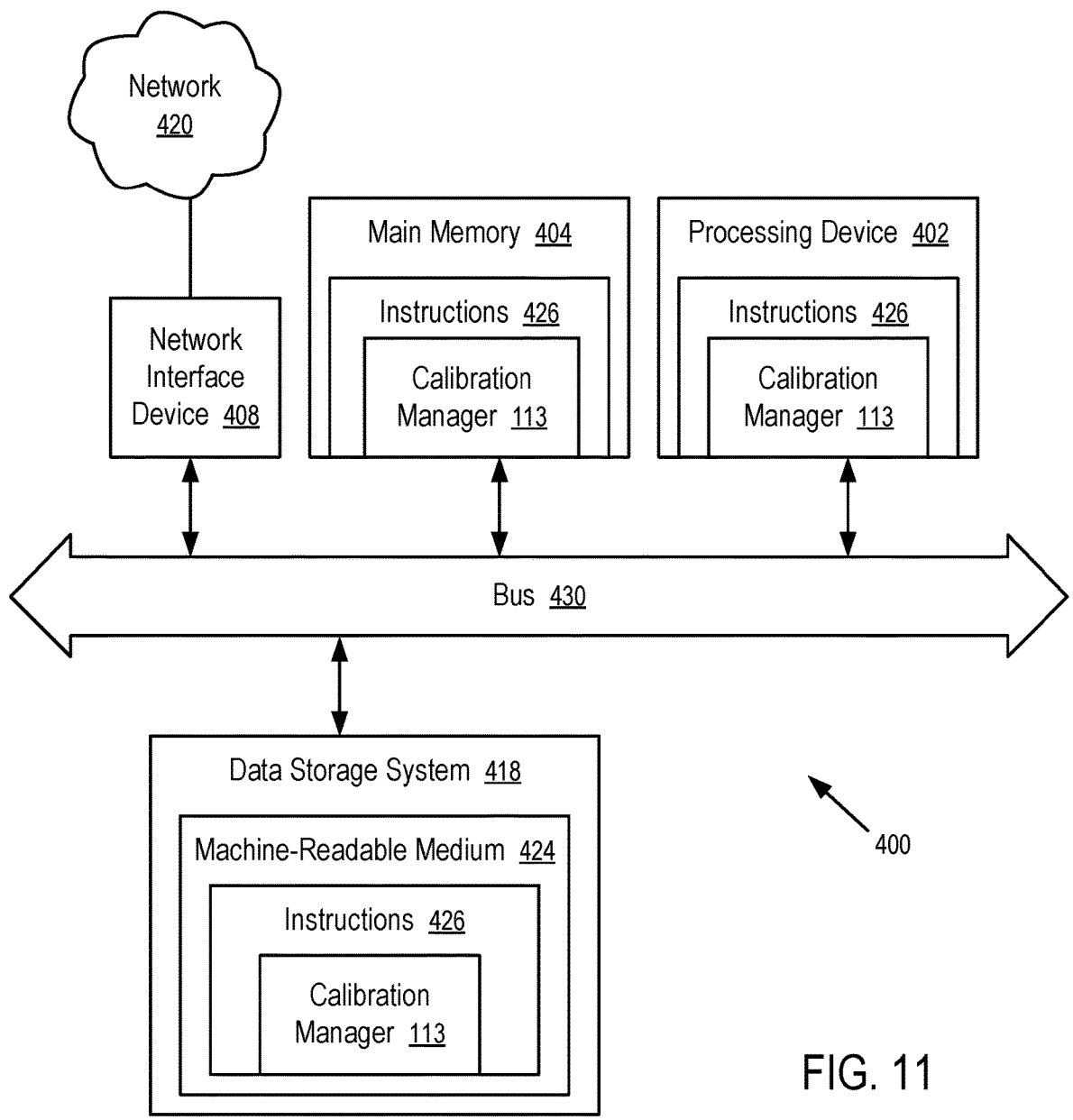
FIG. 11 is a block diagram of an example computer system in which embodiments of the present disclosure can operate.

FIG. 11 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a calibration manager 113 (e.g., to execute instructions to perform operations corresponding to the calibration manager 113 described with reference to FIGS. 1-8). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a calibration manager 113 (e.g., the calibration manager 113 described with reference to FIGS. 1-8). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   receiving a first set of values of a plurality of voltages optimized to read a group of memory cells, wherein each of the memory cells is programmed to store more than one bit of data;
   performing a first read calibration to determine a second set of values of the plurality of voltages optimized to read the group of memory cells;
   computing a plurality of shifts, from the first set of values to the second set of values, respectively for the plurality of voltages optimized to read the group of memory cells;
   identifying a pattern in the plurality of shifts computed for the plurality of voltages respectively; and
   controlling a second read calibration based on the pattern in the shifts.

2. The method of claim 1, wherein the pattern is identified to be associated with transient voltage threshold, charge loss, read disturb, or read noise.

3. The method of claim 2, wherein in response to a determination that the pattern is associated with transient voltage threshold, the second read calibration is performed without using the second set of values.

4. The method of claim 3, wherein the pattern associated with transient voltage threshold is identified from a determination that the second set of values are larger than the first set of values respectively for the plurality of voltages optimized to read the group of memory cells.

5. The method of claim 4, wherein the second read calibration is performed using the first set of values as initial estimates of the plurality of voltages optimized to read the group of memory cells.

6. The method of claim 5, wherein the second read calibration is performed in response to the pattern being associated with transient voltage threshold.

7. The method of claim 2, wherein in response to a determination that the pattern is associated with charge loss, the second read calibration is performed using the second set of values as initial estimates of the plurality of voltages optimized to read the group of memory cells during the second read calibration.

8. The method of claim 7, wherein the pattern associated with charge loss is identified from a determination that the second set of values are smaller than the first set of values respectively for the plurality of voltages optimized to read the group of memory cells.

9. The method of claim 2, wherein the pattern is associated with read disturb and is identified from a determination that only a lowest one of the second set of values is larger than a respective lowest one of the first set of values for the plurality of voltages optimized to read the group of memory cells.

10. The method of claim 2, wherein the pattern is associated with read noise and is identified from a determination that:
- a lowest one of the second set of values is no larger than a respective lowest one of the first set of values,
  - a difference between a first pair in the second set of values is larger than a respective pair in the first set of values corresponding to two first adjacent optimized read voltages in the plurality of voltages optimized to read the group of memory cells, and
  - a difference between a second pair in the second set of values is smaller than a respective pair in the first set of values corresponding to two second adjacent optimized read voltages in the plurality of voltages optimized to read the group of memory cells.

11. The method of claim 10, wherein in response to a determination that the pattern is associated with read noise, the second read calibration is performed using the first set of values as initial estimates of the plurality of voltages optimized to read the group of memory cells during the second read calibration.

12. A memory sub-system, comprising:
- a processing device; and
- at least one memory device, the memory device having:
  - a group of memory cells formed on an integrated circuit die; and
  - a calibration circuit configured to measure signal and noise characteristics of memory cells in the memory device;
- wherein in response to a command from the processing device, the calibration circuit is configured to iteratively calibrate a plurality of read voltages of the group of memory cells;
- wherein a first calibration determines, based on a first plurality of values of the plurality of read voltages respectively, a second plurality of values of the plurality of read voltages; and
- wherein a second calibration is controlled based on an identification of a pattern in shifts from the first plurality of values to the second plurality of values respectively.

13. The memory sub-system of claim 12, wherein in response to a determination that the pattern corresponds to the shifts being upward for the plurality of read voltages respectively, the second calibration is performed using the first plurality of values as initial estimates of the plurality of read voltages.

14. The memory sub-system of claim 12, wherein in response to a determination that the pattern corresponds to the shifts being downward for the plurality of read voltages respectively, the second calibration is performed using the second plurality of values as initial estimates of the plurality of read voltages.

15. The memory sub-system of claim 12, wherein in response to a determination that the pattern corresponds to only a shift for a lowest one of plurality of read voltages being upward, the calibration circuit performs read disturb mitigation.

16. The memory sub-system of claim 12, wherein in response to a determination that the pattern corresponds to a shift for a lowest one of plurality of read voltages being downward, two first adjacent read voltages moving closer, and two second adjacent read voltages moving apart, the calibration circuit performs read noise mitigation.

17. A memory device, comprising:
- a plurality of groups of memory cells formed on an integrated circuit die; and
- a calibration circuit configured to measure signal and noise characteristics of memory cells in the memory device;
- wherein in response to a read command received in the memory device, the calibration circuit is configured to iteratively calibrate a plurality of read voltages of the group of memory cells;
- wherein during a first calibration, the calibration circuit measures signal and noise characteristics in test voltage ranges centered at first values of the read voltages and computes second values of the read voltages from the signal and noise characteristics measured in the test voltages centered at the first values;
- wherein the memory device is further configured to identify a pattern of shifts from the first values to the second values for the read voltages respectively and control a second calibration according to an identification of the pattern.

18. The memory device of claim 17, wherein the pattern is associated with effect of transient voltage threshold, effect of charge loss, effect of read disturb, or effect of read noise.

19. The memory device of claim 18, wherein when the pattern is associated with effect of transient voltage threshold, the calibration circuit measures, during the second calibration, signal and noise characteristics in the test voltage ranges centered at the first values of the read voltages.

20. The memory device of claim 18, wherein when the pattern is associated with effect of charge loss, the calibration circuit measures, during the second calibration, signal and noise characteristics in test voltage ranges centered at the second values of the read voltages.

* * * * *